United States Patent
Zettel et al.

(10) Patent No.: US 7,550,946 B2
(45) Date of Patent: Jun. 23, 2009

(54) METHOD AND APPARATUS FOR REAL-TIME LIFE ESTIMATION OF AN ELECTRIC ENERGY STORAGE DEVICE IN A HYBRID ELECTRIC VEHICLE

(75) Inventors: Andrew M. Zettel, Ann Arbor, MI (US); Anthony H. Heap, Ann Arbor, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 285 days.

(21) Appl. No.: 11/422,691

(22) Filed: Jun. 7, 2006

(65) Prior Publication Data

US 2007/0285061 A1 Dec. 13, 2007

(51) Int. Cl.
$H02J\ 7/00$ (2006.01)
(52) U.S. Cl. .................. 320/132; 320/150; 324/430
(58) Field of Classification Search ............ 320/104, 320/132, 150; 324/430
See application file for complete search history.

(56) References Cited

U.S. PATENT DOCUMENTS

| | | | | |
|---|---|---|---|---|
| 6,353,306 B1* | 3/2002 | Mixon | ...................... | 320/160 |
| 2003/0184307 A1* | 10/2003 | Kozlowski et al. | .......... | 324/427 |
| 2004/0189254 A1* | 9/2004 | Kapsokavathis et al. | .... | 320/132 |
| 2006/0001399 A1* | 1/2006 | Salasoo et al. | .............. | 320/104 |
| 2006/0036883 A1* | 2/2006 | Hashizumi et al. | .......... | 713/300 |
| 2006/0284601 A1* | 12/2006 | Salasoo et al. | .............. | 320/150 |
| 2007/0120535 A1* | 5/2007 | Wallace | ...................... | 320/134 |

* cited by examiner

*Primary Examiner*—Akm E Ullah
*Assistant Examiner*—Arun Williams

(57) ABSTRACT

A hybrid vehicular powertrain includes an electrical energy storage device. State-of-life for the electrical energy storage device is predictively determined based on electrical current, state-of-charge, and temperature of the electrical energy storage device during active and quiescent periods of operation.

12 Claims, 2 Drawing Sheets

METHOD AND APPARATUS FOR REAL-TIME LIFE ESTIMATION OF AN ELECTRIC ENERGY STORAGE DEVICE IN A HYBRID ELECTRIC VEHICLE

TECHNICAL FIELD

This invention pertains generally to life expectancy estimations for an electrical energy storage device.

BACKGROUND OF THE INVENTION

Various systems use energy storage devices to supply electrical energy to electrical machines which are operable to provide motive torque. One such hybrid powertrain architecture comprises a two-mode, compound-split, electromechanical transmission which utilizes an input member for receiving power from a prime mover power source and an output member for delivering power from the transmission to a vehicle driveline, often in conjunction with an internal combustion engine. First and second motor/generators are operatively connected to an energy storage device for interchanging electrical power between the storage device and the first and second motor/generators. A control unit is provided for regulating the electrical power interchange between the energy storage device and the first and second motor/generators. The control unit also regulates electrical power interchange between the first and second motor/generators.

One of the design considerations in vehicle powertrain systems is an ability to provide consistent vehicle performance and component/system service life. Hybrid vehicles, and more specifically the battery pack systems utilized therewith, provide vehicle system designers with new challenges and tradeoffs. It has been observed that service life of an electrical energy storage device, e.g. a battery pack system, increases as resting temperature of the battery pack decreases. However, cold operating temperature introduces limits in battery charge/discharge performance until temperature of the pack is increased. A warm battery pack is more able to supply required power to the vehicle propulsion system, but continued warm temperature operation may result in diminished service life.

Modern hybrid vehicle systems manage various aspects of operation of the hybrid system to effect improved service life of the battery. For example, depth of battery discharge is managed, amp-hour (A-h) throughput is limited, and convection fans are used to cool the battery pack. Ambient environmental conditions in which the vehicle is operated has largely been ignored. However, the ambient environmental conditions may have significant effect upon battery service life. Specifically, same models of hybrid vehicles released into various geographic areas throughout North America would likely not result in the same battery pack life, even if all the vehicles were driven on the same cycle. The vehicle's environment must be considered if a useful estimation of battery life is to be derived. Additionally, customer expectations, competition and government regulations impose standards of performance, including for service life of battery packs, which must be met.

End of service life of a battery pack may be indicated by ohmic resistance of the battery pack. The ohmic resistance of the battery pack is typically flat during much of the service life of the vehicle and battery pack however, thus preventing a reliable estimate of real-time state-of-life ('SOL') of the battery pack throughout most of the service life. Instead, ohmic resistance is most useful to indicate incipient end of service life of the battery pack.

Therefore, there is a need to for a method and apparatus to provide a reliable real-time state-of-life of an energy storage device for a hybrid vehicle.

SUMMARY OF THE INVENTION

A hybrid vehicular powertrain includes an electrical energy storage device operative to exchange electrical energy with a first and second electric machines each machine operable to impart torque to a two-mode, compound-split electromechanical transmission having four fixed gear ratios and two continuously variable operating modes. A method to determine state-of-life of the electrical energy storage device includes monitoring electrical current through the electrical energy storage device, monitoring a state-of-charge of the electrical energy storage device, monitoring temperature of the electrical energy storage device during active periods of operation, and monitoring temperature of the electrical energy storage device during quiescent periods of operation. The method further includes determining a state-of-life of the electrical energy storage device based upon the electrical current, the state-of-charge, and the temperature of the electrical energy storage device during active periods of operation and during quiescent periods of operation. And, a state-of-life of the electrical energy storage device is determined based upon the electrical current, the state-of-charge, and the temperature of the electrical energy storage device during periods of vehicle activity and during periods of vehicle inactivity.

BRIEF DESCRIPTION OF THE DRAWINGS

The invention may take physical form in certain parts and arrangement of parts, an embodiment of which is described in detail and illustrated in the accompanying drawings which form a part hereof, and wherein.

DETAILED DESCRIPTION OF AN EMBODIMENT OF THE INVENTION

Figure 1:
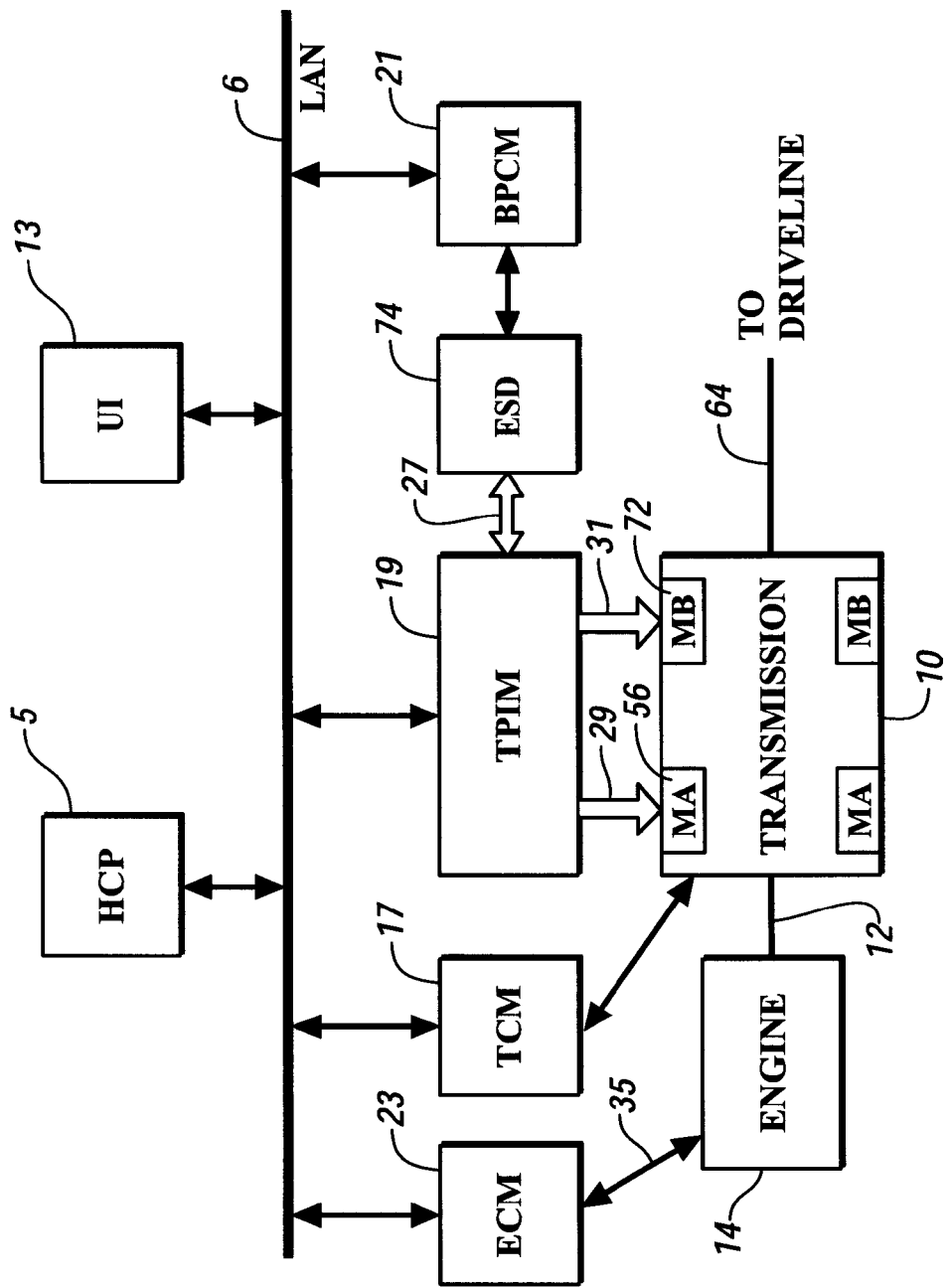
FIG. 1 is a schematic diagram of an exemplary architecture for a control system and powertrain, in accordance with the present invention; and, FIG. 2 is an algorithmic block diagram, in accordance with the present invention.

Referring now to the drawings, wherein the showings are for the purpose of illustrating the invention only and not for the purpose of limiting the same, FIG. 1 shows a control system and an exemplary hybrid powertrain system which has been constructed in accordance with an embodiment of the invention. The exemplary hybrid powertrain system comprises a plurality of torque-generative devices operable to supply motive torque to a transmission device, which supplies motive torque to a driveline. The torque-generative devices preferably comprise an internal combustion engine 14 and first and second electric machines 56, 72 operable to convert electrical energy supplied from an electrical storage device 74 to motive torque. The exemplary transmission device 10 comprises a two-mode, compound-split electro-mechanical transmission having four fixed gear ratios, and includes a plurality of gears operable to transmit the motive torque to an output shaft 64 and driveline through a plurality of torque-transfer devices contained therein. Mechanical aspects of exemplary transmission 10 are disclosed in detail in U.S. Pat. No. 6,953,409, entitled "Two-Mode, Compound-Split, Hybrid Electro-Mechanical Transmission having Four Fixed Ratios", which is incorporated herein by reference.

Referring again to FIG. 1, the control system comprises a distributed control module architecture interacting via a local area communications network to provide ongoing control to the powertrain system, including the engine 14, the electrical machines 56, 72, and the transmission 10.

The exemplary powertrain system been constructed in accordance with an embodiment of the present invention. The hybrid transmission 10 receives input torque from torque-generative devices, including the engine 14 and the electrical machines 56, 72, as a result of energy conversion from fuel or electrical potential stored in electrical energy storage device (ESD) 74. The ESD 74 typically comprises one or more batteries. Other electrical energy storage devices that have the ability to store electric power and dispense electric power may be used in place of the batteries without altering the concepts of the present invention. The ESD 74 is preferably sized based upon factors including regenerative requirements, application issues related to typical road grade and temperature, and, propulsion requirements such as emissions, power assist and electric range. The ESD 74 is high voltage DC-coupled to transmission power inverter module (TPIM) 19 via DC lines referred to as transfer conductor 27. The TPIM 19 transfers electrical energy to the first electrical machine 56 by transfer conductors 29, and the TPIM 19 similarly transfer electrical energy to the second electrical machine 72 by transfer conductors 31. Electrical current is transferable between the electrical machines 56, 72 and the ESD 74 in accordance with whether the ESD 74 is being charged or discharged. TPIM 19 includes the pair of power inverters and respective motor control modules configured to receive motor control commands and control inverter states therefrom for providing motor drive or regeneration functionality.

The electrical machines 56, 72 preferably comprise known motors/generator devices. In motoring control, the respective inverter receives current from the ESD and provides AC current to the respective motor over transfer conductors 29 and 31. In regeneration control, the respective inverter receives AC current from the motor over the respective transfer conductor and provides current to the DC lines 27. The net DC current provided to or from the inverters determines the charge or discharge operating mode of the electrical energy storage device 74. Preferably, machine A 56 and machine B 72 are three-phase AC electrical machines and the inverters comprise complementary three-phase power electronic devices.

The elements shown in FIG. 1, and described hereinafter, comprise a subset of an overall vehicle control architecture, and are operable to provide coordinated system control of the powertrain system described herein. The control system is operable to gather and synthesize pertinent information and inputs, and execute algorithms to control various actuators to achieve control targets, including such parameters as fuel economy, emissions, performance, driveability, and protection of hardware, including batteries of ESD 74 and motors 56, 72. The distributed control module architecture of the control system comprises an engine control module ('ECM') 23, transmission control module ('TCM') 17, battery pack control module ('BPCM') 21, and the Transmission Power Inverter Module ('TPIM') 19. A hybrid control module ('HCP') 5 provides overarching control and coordination of the aforementioned control modules. There is a User Interface ('UI') 13 operably connected to a plurality of devices through which a vehicle operator typically controls or directs operation of the powertrain, including the transmission 10. Exemplary vehicle operator inputs to the UI 13 include an accelerator pedal, a brake pedal, transmission gear selector, and, vehicle speed cruise control. Within the control system, each of the aforementioned control modules communicates with other control modules, sensors, and actuators via a local area network ('LAN') communications bus 6. The LAN bus 6 allows for structured communication of control parameters and commands between the various control modules. The specific communication protocol utilized is application-specific. By way of example, one communications protocol is the Society of Automotive Engineers standard J1939. The LAN bus and appropriate protocols provide for robust messaging and multi-control module interfacing between the aforementioned control modules, and other control modules providing functionality such as antilock brakes, traction control, and vehicle stability.

The HCP 5 provides overarching control of the hybrid powertrain system, serving to coordinate operation of the ECM 23, TCM 17, TPIM 19, and BPCM 21. Based upon various input signals from the UI 13 and the powertrain, the HCP 5 generates various commands, including: an engine torque command, clutch torque commands, for various clutches of the hybrid transmission 10; and motor torque commands, for the electrical machines A and B, respectively.

The ECM 23 is operably connected to the engine 14, and functions to acquire data from a variety of sensors and control a variety of actuators, respectively, of the engine 14 over a plurality of discrete lines collectively shown as aggregate line 35. The ECM 23 receives the engine torque command from the HCP 5, and generates an axle torque request. For simplicity, ECM 23 is shown generally having bi-directional interface with engine 14 via aggregate line 35. Various parameters that are sensed by ECM 23 include engine coolant temperature, engine input speed to the transmission, manifold pressure, ambient air temperature, and ambient pressure. Various actuators that may be controlled by the ECM 23 include fuel injectors, ignition modules, and throttle control modules.

The TCM 17 is operably connected to the transmission 10 and functions to acquire data from a variety of sensors and provide command control signals, i.e. clutch torque commands to the clutches of the transmission.

The BPCM 21 interacts with various sensors associated with the ESD 74 to derive information about the state of the ESD 74 to the HCP 5. Such sensors comprise voltage and electrical current sensors, as well as ambient sensors operable to measure operating conditions of the ESD 74 including, e.g., temperature and resistance measured across terminals of the ESD 74 (not shown). Sensed parameters include ESD voltage, $V_{BAT}$, ESD current, $I_{BAT}$, and ESD temperature, $T_{BAT}$. Derived parameters preferably include ESD current, $I_{BAT}$, ESD internal, $R_{BAT}$, as may be measured across terminals of the ESD, ESD state-of-charge, SOC, and other states of the ESD, including available electrical power, $P_{BAT\_MIN}$ and $P_{BAT\_MAX}$.

The Transmission Power Inverter Module (TPIM) 19 includes the aforementioned power inverters and machine control modules configured to receive motor control commands and control inverter states therefrom to provide motor drive or regeneration functionality. The TPIM 19 is operable to generate torque commands for machines A and B based upon input from the HCP 5, which is driven by operator input through UI 13 and system operating parameters. Motor torques are implemented by the control system, including the TPIM 19, to control the machines A and B. Individual motor speed signals are derived by the TPIM 19 from the motor phase information or conventional rotation sensors. The TPIM 19 determines and communicates motor speeds to the HCP 5.

Each of the aforementioned control modules of the control system is preferably a general-purpose digital computer generally comprising a microprocessor or central processing unit, read only memory (ROM), random access memory (RAM), electrically programmable read only memory (EPROM), high speed clock, analog to digital (A/D) and digital to analog (D/A) circuitry, and input/output circuitry and devices (I/O) and appropriate signal conditioning and buffer circuitry. Each control module has a set of control algorithms, comprising resident program instructions and calibrations stored in ROM and executed to provide the respective functions of each computer. Information transfer between the various computers is preferably accomplished using the aforementioned LAN 6.

Algorithms for control and state estimation in each of the control modules are typically executed during preset loop cycles such that each algorithm is executed at least once each loop cycle. Algorithms stored in the non-volatile memory devices are executed by one of the central processing units and are operable to monitor inputs from the sensing devices and execute control and diagnostic routines to control operation of the respective device, using preset calibrations. Loop cycles are typically executed at regular intervals, for example each 3.125, 6.25, 12.5, 25 and 100 milliseconds during ongoing engine and vehicle operation. Alternatively, algorithms may be executed in response to occurrence of an event.

The action described hereinafter occurs during active operation of the vehicle, i.e. that period of time when operation of the engine and electrical machines are enabled by the vehicle operator, typically through a 'key-on' action. Quiescent periods include periods of time when operation of the engine and electrical machines are disabled by the vehicle operator, typically through a 'key-off' action. In response to an operator's action, as captured by the UI 13, the supervisory HCP control module 5 and one or more of the other control modules determine required transmission output torque, $T_O$. Selectively operated components of the hybrid transmission 10 are appropriately controlled and manipulated to respond to the operator demand. For example, in the exemplary embodiment shown in FIG. 1, when the operator has selected a forward drive range and manipulates either the accelerator pedal or the brake pedal, the HCP 5 determines how and when the vehicle is to accelerate or decelerate. The HCP 5 also monitors the parametric states of the torque-generative devices, and determines the output of the transmission required to effect a desired rate of acceleration or deceleration. Under the direction of the HCP 5, the transmission 10 operates over a range of output speeds from slow to fast in order to meet the operator demand.

Figure 2:
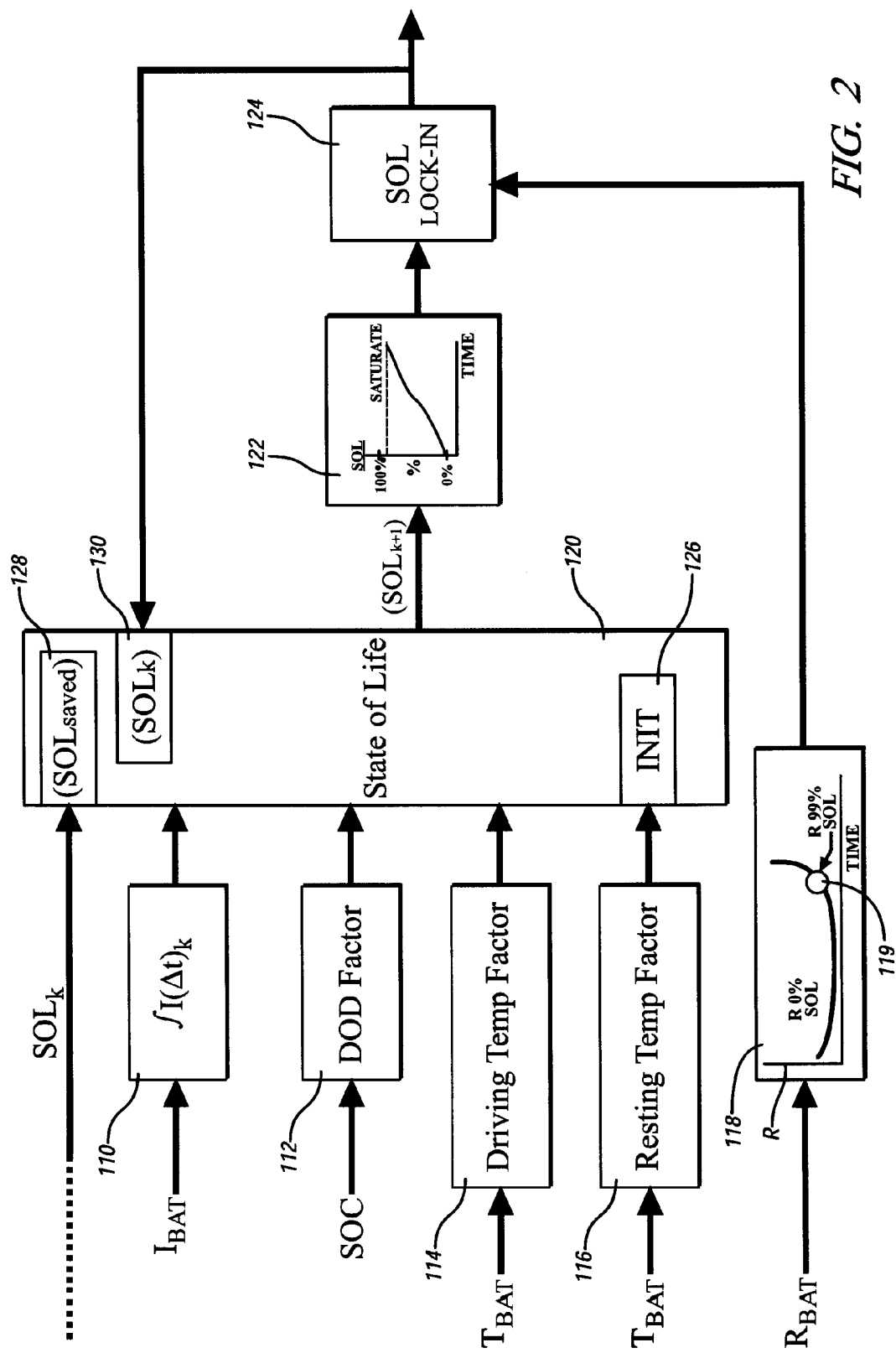

Referring now to FIG. 2, a schematic diagram is shown, demonstrating an exemplary method for estimating a state-of-life of the ESD 74 in real-time, based upon monitored inputs. The method is preferably executed as one or more algorithms in one of the control modules of the control system, typically the HCP 5. The estimated state-of-life of the ESD 74 ('$SOL_K$') is preferably stored as a scalar value in a non-volatile memory location for reference, updating, and for resetting, each occurring at appropriate points during life of the vehicle and the ESD 74.

Overall, determining a parametric value for the SOL comprises monitoring in real-time an ESD current $I_{BAT}$ (in amperes), an ESD temperature $T_{BAT}$, an ESD voltage $V_{BAT}$, an ESD resistance $R_{BAT}$, and ESD State-of Charge. These parameters, $I_{BAT}$, $T_{BAT}$, $V_{BAT}$, and $R_{BAT}$, are used to determine a parametric value for ESD current integrated over time 110, a parametric value for depth of discharge factor 112, a parametric value for driving temperature factor 114, and, a parametric value for resting temperature factor 116. Each of the aforementioned factors, i.e. the integrated ESD current, depth of discharge, driving temperature factor, and resting temperature factor, are combined, preferably by a summing operation, with a previously determined state-of-life factor, $SOL_K$, to determine a parametric value for the SOL, i.e. $SOL_{K+1}$, shown as an output of block 120. The algorithm to determine the state-of-life factor, $SOL_K$, is preferably executed multiple times during each trip (defined as an engine on-off cycle).

When the operation of the engine and electrical machines are enabled by the vehicle operator, typically through a 'key-on' action and the engine is initially started, there is an initial state-of-life factor, $SOL_K$, which is used in calculating subsequent values for SOL, and is shown as $SOL_{SAVED}$ 128. The $SOL_{SAVED}$ factor 128 is only used once during each trip, and is supplanted in future calculations during the trip by the $SOL_{K+1}$ factor output from Blocks 120, 122, and 124, which is shown as Block 130. Similarly, the resting temperature factor output from Block 116 is only used during the first execution of the algorithm to calculate SOL after the engine/vehicle is initially started or turned on, as is indicated by the INIT block 126. On subsequent executions of the algorithm to calculate SOL, the resting temperature factor is omitted from the calculation of SOL.

During each execution of the algorithm, the output of block 120, i.e. $SOL_{K+1}$, is evaluated to determine whether it has reached a saturation value, as shown in block 122. The algorithm acts further to 'lock-in' or fix the parametric value for SOL when ESD internal resistance, $R_{BAT}$, indicates the ESD 74 is approaching end of life, as output from block 118. In any event, the SOL value output from Block 124 is saved in a non-volatile memory device as $SOL_K$, for use in future calculations of SOL, as indicated by Block 130. This operation is described in more detail hereinafter.

Calculating ESD state-of-charge ('SOC'), including depth-of-discharge ('DOD'), comprises monitoring ESD temperature during active and quiescent periods of ESD operation. Quiescent periods of ESD operation are characterized by ESD power flow that is de minimus whereas active periods of ESD operation are characterized by ESD power flow that is not de minimus. That is to say, quiescent periods of ESD operation are generally characterized by no or minimal current flow into or out of the ESD. With respect to an ESD associated with a hybrid vehicle propulsion system for example, quiescent periods of ESD operation may be associated with periods of vehicle inactivity (e.g. powertrain, including electric machines, is inoperative such as during periods when the vehicle is not being driven and accessory loads are off but may include such periods characterized by parasitic current draws as are required for continuing certain controller operations including, for example, the operations associated with the present invention). Active periods of ESD operation in contrast may be associated with periods of vehicle activity (e.g. accessory loads are on and/or the powertrain, including electric machines, is operative such as during periods when the vehicle is being driven wherein current flows may be into or out of the ESD).

The $SOL_K$ factor used during initial execution of the algorithm after engine start up, and shown as the $SOL_{SAVED}$ factor 128 in FIG. 2 is derived as follows. Upon initial start of a vehicle at a vehicle assembly plant a parametric value for $SOL_K$ is initialized to a baseline value, in this embodiment equal to zero. The value for $SOL_K$ may also be set to zero upon replacement of the ESD 74. The $SOL_K$ factor may be reduced to a non-zero value, i.e. above the baseline value, under certain identifiable circumstances that may occur during vehicle service. In this instance, calibrations may be used that allow a member of the service community to offset an existing $SOL_K$ factor. Such identifiable circumstances include: partial replacement of modules within the ESD 74; refreshing of the ESD 74 using known methods for increasing ESD operating life; replacing the ESD with a known system having a known $SOL_K$ factor. Furthermore, as shown in FIG. 2, the magnitude of the $SOL_K$ factor may be reduced by the SOL resting temperature factor when the ESD experiences resting temperatures that are lower than a calibrated value during a quiescent period between adjacent engine operating periods.

The DOD factor output from Block 112 preferably comprises a well-known and determinable value in the control system for each ESD 74. Each parametric value for DOD comprises a measure of quantity of 100% DOD cycles, i.e. the quantity of times an individual ESD is 100% discharged. For example, a typical Nickel-Metal Hydride (NiMh) battery system for a hybrid vehicle is known to fail after 700 100%-DOD cycles. As magnitude of discharge (measured in %-DOD) decreases, life expectancy and performance of the ESD is known to improve exponentially. For illustrative purposes, the range of parametric values for the SOL factor is within the same order of magnitude as the DOD factor, i.e., 0 to 1000 units. The SOL factor is preferably of sufficient resolution to capture the effect of each and every drive cycle as well as significant resting or quiescent periods.

Determination of a parametric value for the depth of discharge (DOD) factor is preferably determined during vehicle operation. The DOD factor comprehends and incorporates all DOD events that are greater than a calibratable value, e.g. 0.5% of total ESD capacity. A DOD event comprises a cycle of ESD discharge and subsequent charge to an original state of charge. The DOD factor of this embodiment is set at a value of 0.5% for each 100%-DOD event, and scaled accordingly for other DOD events less than 100%-DOD. Calculation of a parametric value for the DOD factor includes using the actual state of charge, SOC, as an input value. Determination of SOC is known, and not discussed herein.

The DOD factor 112 includes calculating effects of extended resting periods on SOL of the ESD. Known ESD systems used on vehicles and other applications have determinable self-discharge rates. A typical known self-discharge rate is 0.5% per day, and is adjustable based upon device temperature, i.e. $T_{BAT}$. Higher temperatures typically result in a higher self-discharge rate. The invention determines ESD SOC at vehicle shutdown and recalculates SOC at a subsequent start of operation to determine the DOD factor as output from 112, reflecting the self-discharge rate. The resultant DOD Factor output from block 112 is used in the SOL calculation, shown at 120.

By way of example, a parametric value for the DOD factor 112 is determined thusly. A vehicle operator having a newly manufactured hybrid vehicle with a new ESD neglects to put fuel in the vehicle, completely discharges the ESD 74 from 100% to 0%. The DOD Factor Monitor passes a value of 1, which is added to the existing SOL of 0, with a resultant SOL of approximately 1. The SOL factor would likely be slightly larger, because of the other calculated contributions to SOL factor.

By way of example the feature related to extended resting or quiescence, a parametric value for the DOD factor 112 is determined thusly. A vehicle operator arrives at an airport and shuts down a hybrid vehicle system currently having a 70% SOC. When the customer returns and starts the vehicle, the DOD Factor monitor detects a 60% SOC. The DOD Factor monitor adds a value of 0.2% to calculation of the SOL, which is obtained through an in-control module calibration table comprising a % DOD as a function of life derived from vehicle testing.

Monitoring current of the ESD preferably comprises measuring and integrating, as a function of time, the magnitude of the electrical current, $I_{BAT}$, during each active charging and discharging event. The Ampere-hour (A-h) monitor 110, typically executed during vehicle operation, comprises a measure of cumulative quantity of electrical energy passed through the ESD 74. The standard method for tracking use of an energy storage device is typically through A-h/mile calculations, using $I_{BAT}$, elapsed time, and vehicle miles driven as input parameters. Preproduction testing of a specifically designed ESD yields a typical amount of average A-h/mile required to meet life expectancy targets for the ESD 74. The exemplary A-h monitor calculates a contribution to SOL 120 in real-time. The A-h contribution may pass data in real-time to update the SOL, or, alternatively, update the SOL at the end of each driving cycle. Use of the A-h/mile method of tracking ESD usage makes the SOL determination 120 robust to extended periods of vehicle resting at zero speed, and adjusts the A-h/mile parameter before its contribution to calculation of the SOL.

By way of example, a parametric value for the A-h monitor 110 is determined thusly. An operator has a hybrid vehicle with 50,000 miles and an ESD with an existing SOL factor of 195.987. The vehicle is driven to work, wherein the cumulative calculated A-h/mile value is 6.52 A-h/mile. The monitor maps this calculation, using a precalibrated lookup table, and determines the A-h monitor factor to be 0.003. The A-h monitor factor is added to the SOL, thus becoming 195.990.

By way of another example, a parametric value for the A-h monitor 110 is determined thusly with the following exception. An operator operates an exemplary vehicle at idle, with the hybrid system cycling between an internal combustion engine-on mode and a ESD-only mode. The A-h monitor calculates a first value, e.g. 32 A-h/mile, and corrects the first value by the percentage of total time the vehicle was operated at zero speed.

Determining a parametric value for the resting temperature factor, shown at 116, comprises monitoring temperature of the ESD during a quiescent period, or resting temperature monitoring, referred to as $T_{REST}$. The resting temperature factor is preferably determined at engine/vehicle startup, and is only used to calculate $SOL_{K+1}$ at the first occurrence of execution of the SOL algorithm during each engine-on cycle, as indicated by block 126. On subsequent calculations of SOL during each engine-on cycle, the resting temperature factor is omitted from the calculation. An exemplary method and apparatus for determining ESD temperature during a quiescent period, when the vehicle is not operating, are disclosed in detail in U.S. patent application Ser. No. 11/422.679, entitled "Method and Apparatus for Determining the Effect of Temperature Upon Life Expectancy of an Electric Energy Storage Device in a Hybrid Electric Vehicle", which is incorporated herein by reference.

Another contribution to ESD service life comprises the conditions the ESD experiences during each quiescent, or resting, period. The invention determines resting average resting temperature of the ESD based upon input parameter $T_{BAT}$, and applies a bias value to the SOL each time the vehicle/engine undergoes a startup, based thereon. Because ESD life data is typically determined at a temperature around 25 C, a zero bias is applied for resting temperatures at that level. The bias value is exponentially applied for lower and higher resting temperatures. In some applications, because of difficulty in properly estimating resting temperature of vehicles over multiple subsequent days, the algorithm may include larger zero bias areas at and near temperatures around 25 C. while disabling inputs for this monitor, such as length of resting time.

Determining a parametric value for the driving temperature factor $T_{DRIVE}$ which is output from block 114 comprises monitoring ESD temperature, $T_{BAT}$ during vehicle operation, and is preferably executed in real-time. While operating the vehicle, a small component of the SOL is calculated using a running average temperature calculation, based upon the ESD temperature input parameter, $T_{BAT}$. This is similar to the application of the resting temperature monitor, however it is much smaller in magnitude, and in the current application is executed at a slower calculation rate than the base process.

The end-of-life resistance monitor which is output from Block 118, comprises monitoring resistance, $R_{BAT}$ of the ESD. Calculation of resistance of the ESD, $R_{BAT}$, is preferably derived from a measure of ESD current $I_{BAT}$, and ESD voltage, $V_{BAT}$. Near end-of-service life of a typical ESD, there is a characteristic 'knee' in the measured resistance curve, as shown at 119, which is readily determinable by an algorithm which monitors $R_{BAT}$ over time, preferably executed the control system. The resistance of the ESD calculated throughout its life typically lacks useable information, because it is relatively flat and depends upon temperature. However, at a point near end-of-life, the magnitude of the resistance, $R_{BAT}$, is known to change in an uncharacteristic manner in a relatively short length of time. The change is resistance is detectable by monitoring resistance over time, and when the resistance value changes by an amount greater than a minimum amount, as shown at 118, a software flag is set, and operation of the algorithm is altered by locking in or fixing the parametric value for SOL, as shown at 124.

Detection of the characteristic 'knee' provides information to the vehicle control system which permits improved prediction of end-of-service life (EOL) of the ESD, and gives sufficient time for the control system to adjust control of the vehicle, especially control of the engine 14 and electrical machines 56, 72, when necessary. A typical action by the control system in response to the software flag being set as a result in the change in ESD performance can include reduction in electrical power limit levels to machines 56, 72 to extend service life of the ESD, thus permitting a longer timeframe to repair/replace the ESD. This becomes important at lower ambient temperatures when the ESD comprises the sole electrical energy source for start of the engine 14. The exemplary resistance-monitoring algorithm monitors the resistance of the ESD, and, upon detection of the 'knee' clamps the determined SOL value to a known value that is recognizable by the control system to indicate approaching, or imminent, end of service life of the ESD, which is the action that occurs at Block 124. This value is referred to herein as "SOL factor lock-in".

In operation, when a parametric value for the SOL value reaches below 100% and below the "SOL factor lock-in" (e.g., 95%), and before achieving the resistance threshold indicating end of service life, it saturates at a known value (e.g. 90%) 122. This provides the control system a clear indication that end of service life of the ESD 74 is being approached, while indicating the remaining service life of the ESD is unknown.

The invention has been described with specific reference to the preferred embodiments and modifications thereto. Further modifications and alterations may occur to others upon reading and understanding the specification. It is intended to include all such modifications and alterations insofar as they come within the scope of the invention.

Having thus described the invention, it is claimed:

1. Method to determine state-of-life of an electrical energy storage device operative to exchange electrical energy with a hybrid vehicular powertrain including first and second electric machines each machine operable to impart torque to a two-mode, compound-split electromechanical transmission having four fixed gear ratios and two continuously variable operating modes, comprising: monitoring electrical current through the electrical energy storage device; monitoring a state-of-charge of the electrical energy storage device; monitoring temperature of the electrical energy storage device during periods of vehicle activity;

monitoring temperature of the electrical energy storage device during periods of vehicle inactivity;

determining a state-of-life of the electrical energy storage device based upon the electrical current, the state-of-charge, and the temperature of the electrical energy storage device during periods of vehicle activity and during periods of vehicle inactivity, wherein determining state-of-life includes fixing state-of-life to a predetermined value when said internal resistance indicates incipient end of life of the electrical energy storage device; detecting an internal resistance change over time that is greater than a minimum amount; and fixing the state-of-life to the predetermined value when the internal resistance is greater than the minimum amount.

2. The method of claim 1, wherein monitoring electrical current through the electrical energy storage device comprises calculating a time-integral of the electrical current during active periods of operation.

3. The method of claim 1, wherein monitoring temperature of the electrical energy storage device during periods of vehicle activity comprises monitoring the temperature when at least one of the electrical machines is operative.

4. The method of claim 3, wherein monitoring temperature of the electrical energy storage device during periods of vehicle inactivity comprises monitoring the temperature when both of said electrical machines are inoperative.

5. The method of claim 1, wherein vehicle activity is inferred from a key-on event.

6. The method of claim 1, wherein vehicle inactivity is inferred from a key-off event.

7. The method of claim 1, further comprising monitoring internal resistance of the electrical energy storage device and wherein determining the state-of-life is further based upon said internal resistance.

8. The method of claim 1, further comprising reducing electrical energy storage device power limits when incipient end of life of the electrical energy storage device is indicated.

9. Apparatus for determining state-of-life of an electrical energy storage device operative to exchange electrical energy with a hybrid vehicular powertrain including first and second electric machines each machine operable to impart torque to a two-mode, compound-split electromechanical transmission having four fixed gear ratios and two continuously variable operating modes, comprising:

a temperature sensor adapted for sensing temperature of the electrical energy storage device; and a computer based controller adapted to receive a signal indicative of sensed electrical energy storage device temperature; said computer based controller including a storage medium having a computer program encoded therein, said computer program comprising:

code for monitoring electrical current through the electrical energy storage device;

code for monitoring a state-of-charge of the electrical energy storage device;

code for monitoring temperature of the electrical energy storage device during periods of vehicle activity;

code for monitoring temperature of the electrical energy storage device during periods of vehicle inactivity;

code for monitoring a state-of-life of the electrical energy storage device based upon the electrical current, the state-of-charge, and the temperature of the electrical energy storage device during periods of vehicle activity and during periods of vehicle inactivity; and code to determine state-of-life of the electrical energy storage device, based upon the electrical current, the state-of-charge of the electrical energy storage device, and the temperature of the electrical energy storage device during periods of vehicle activity and during periods of vehicle inactivity, the code to determine the state-of-life including code for fixing state-of-life to a predetermined value when said internal resistance indicates an incipient end of life of the electrical energy storage device;

code for detecting an internal resistance change over time that is greater than a minimum amount; and code for fixing the state-of-life to the predetermined value when the internal resistance is greater than the minimum amount.

10. The apparatus of claim 9, wherein the code for monitoring electrical current comprises code for calculating a time-integral of the electrical current during active periods of operation.

11. The apparatus of claim 9, wherein the computer program further comprises code to monitor internal resistance of the electrical energy storage device and wherein the code to determine state-of-life determines state-of-life based upon said internal resistance.

12. The apparatus of claim 9, wherein the computer program further comprises code to reduce electrical energy storage device power limits when the incipient end of life of the electrical energy storage device is indicated.

* * * * *